United States Patent [19]
Hollmer et al.

[11] Patent Number: 5,638,326
[45] Date of Patent: Jun. 10, 1997

[54] PARALLEL PAGE BUFFER VERIFY OR READ OF CELLS ON A WORD LINE USING A SIGNAL FROM A REFERENCE CELL IN A FLASH MEMORY DEVICE

[75] Inventors: Shane C. Hollmer, San Jose; Pau-Ling Chen, Saratoga; Binh Q. Le, Santa Clara, all of Calif.

[73] Assignee: Advanced Micro Devices, Inc., Sunnyvale, Calif.

[21] Appl. No.: 630,919

[22] Filed: Apr. 5, 1996

[51] Int. Cl.$^6$ .................................................. G11C 7/00
[52] U.S. Cl. ............................ 365/185.2; 365/189.05; 365/210; 365/189.09
[58] Field of Search .......................... 365/185.2, 185.18, 365/185.3, 185.22, 189.05, 210, 189.09

[56] References Cited

U.S. PATENT DOCUMENTS

| | | | |
|---|---|---|---|
| 5,197,028 | 3/1993 | Nakai | 365/210 |
| 5,363,340 | 11/1994 | Ishikawa et al. | 365/289.09 |
| 5,559,737 | 11/1996 | Tanaka et al. | 365/185.2 |

OTHER PUBLICATIONS

Kobayashi, et al., ULSI Laboratory, Mitsubishi Electric Corporation, Itami Japan, *A 3.3 v Only 16 Mb DINOR Flash Memory*.

*Primary Examiner*—Tan T. Nguyen
*Attorney, Agent, or Firm*—Fliesler, Dubb, Meyer & Lovejoy

[57] ABSTRACT

A flash memory including a page buffer with bias circuitry and a reference array enabling reading and verifying values stored on a word line of memory cells in parallel using the page buffer irrespective of temperature, Vcc, and process variations. The bias circuitry includes a cascode transistor having a source connected to the reference cell array which provides a single reference signal. The bias cascode couples the reference signal to an input of a bias inverter in the bias generator, while a bias load transistor in the bias generator couples Vcc to the bias inverter input. The page buffer includes a set of latches that are each coupled to a memory cell by a cascode. A first inverter in each latch has transistors with sizes matching the transistors in the bias inverter. A latch load transistor is connected between a pull-up and pull-down transistor of a second inverter in each latch and is sized to match the bias load transistor. Gates of the bias load transistor and the latch load transistor are both coupled to the output of the bias inverter enabling the first inverter of each latch to have an input mirroring the input of the bias inverter.

23 Claims, 6 Drawing Sheets

PARALLEL PAGE BUFFER VERIFY OR READ OF CELLS ON A WORD LINE USING A SIGNAL FROM A REFERENCE CELL IN A FLASH MEMORY DEVICE

BACKGROUND OF THE INVENTION

1. Field of the Invention

The present invention generally relates to a floating gate memory device, such as a flash memory, which includes a page buffer.

2. Description of the Related Art

A memory cell transistor having a floating gate, such as a flash memory array cell, has a threshold voltage capable of being set to different levels. Both reading a state stored in the memory cell and verifying that a correct value has been programmed or erased requires that the threshold voltage of the memory cell be ascertained. To enable more rapid data access by a processor, the state of the floating gate memory cell can be stored in a page buffer.

Traditionally, memory devices use sense amplifiers and connecting reference cells configured to read or verify the state of one byte of memory cells at a time. Consequently, the read and verify operations take a great deal of time to complete for a large number of memory cells in an array. To enhance access speed, sense amplifier outputs may be provided to a page buffer. To enhance speed further, more than a byte of memory cells can be read or verified in parallel by the sense amplifiers. However, to read or verify more than one byte, the sense amplifiers and connecting circuitry required for each byte of memory cells would provide an unacceptable increase in circuitry. Memory devices providing read and verify of more than one byte in parallel without sense amplifiers are available, but do not provide acceptable accuracy.

Figure 1:
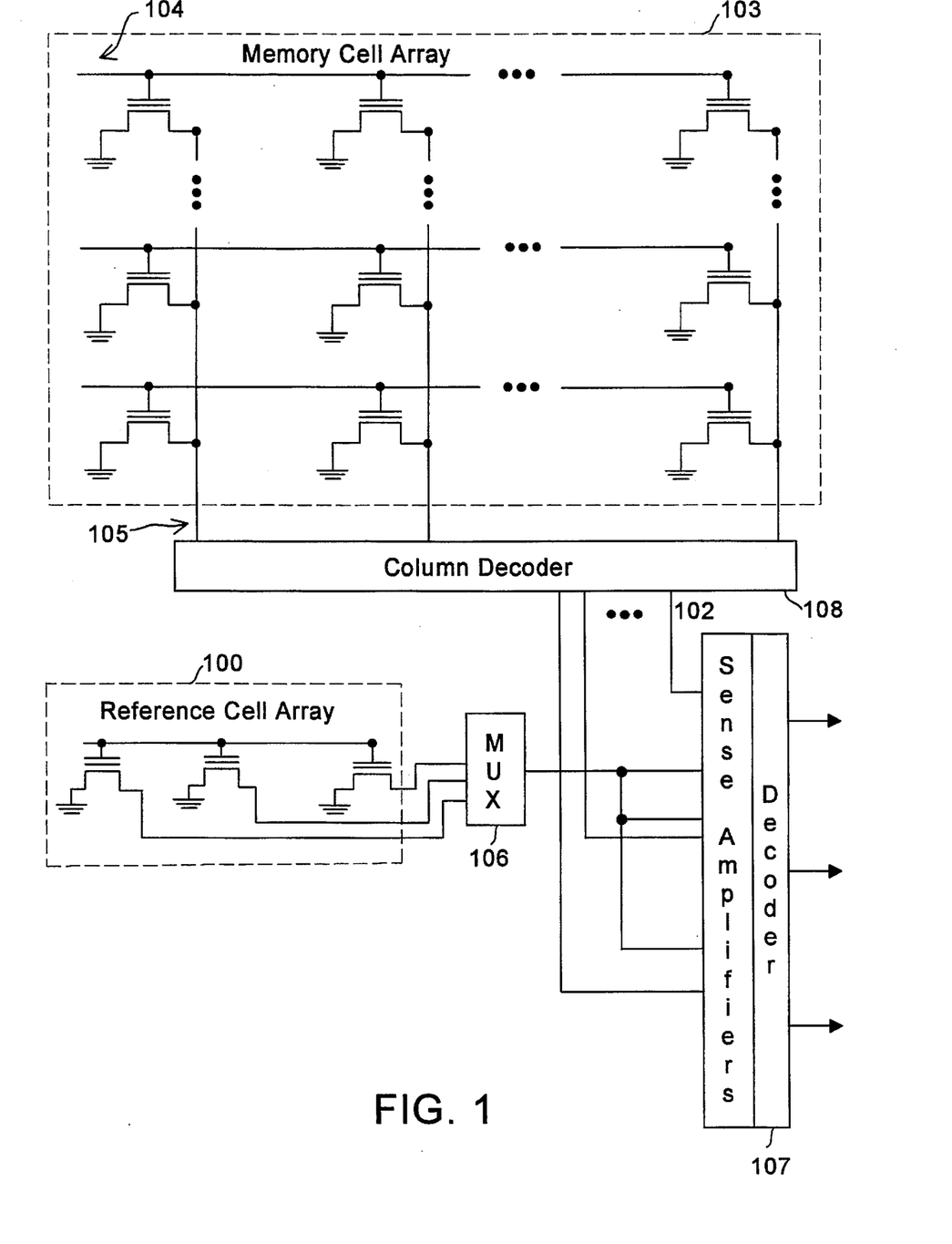
FIG. 1 shows a conventional flash memory device using a programmed reference.

U.S. patent application Ser. No. 08/160,582 entitled "Programmed Reference", filed Dec. 1, 1993, and incorporated herein by reference, discloses a conventional flash memory device as shown in FIG. 1 which uses sense amplifiers and reference cells to perform parallel read and verify operations on one byte of data at a time. The memory device includes a memory cell array 103. The gate of each cell in the memory array 103 is connected to one of word lines 104. The drain of each memory cell 103 is connected to one of bit lines 105.

The memory device employs a reference cell array 100 to determine the values stored in one byte of memory cells at a time. Each set of reference cells 100 includes at least three reference cells, a verify program reference cell having a threshold set for verifying a programmed state, a verify erase cell having a threshold set for verifying erase, and a read reference cell having a threshold set to determine a state stored by a memory cell.

A memory cell is considered to be programmed when its threshold voltage is raised above a set voltage, such as 4.0 volts, and erased when its threshold voltage is below a set voltage, such as 1.0 volt. To verify programming of a memory cell, with the voltage values indicated above, the drain current of the memory cell is compared with the drain current of the verify program reference cell having a threshold of 4.0 volts. The memory cell is determined to be programmed to a threshold above 4.0 volts if its drain current is less than the verify program reference cell drain current. To verify erase of a memory cell, the drain current of the memory cell is compared with the drain current of the verify erase reference cell having a threshold of 1.0 volt. The memory cell threshold is determined to be erased below 1.0 volt if its drain current is greater than the verify erase reference cell drain current. To determine the state stored by a memory cell during read, the drain current of the memory cell is compared with the drain current of a read reference cell having a threshold between the 1.0 volt and 4.0 volt working margin, such as 2.5 volts.

To enable the comparison of the drain currents of the memory cells and the reference cells as described above, each reference cell has its gate connected to a select voltage applied to the word lines 104 of the memory cells. The drains of each set of reference transistors 100 are connected to the input of multiplexer 106. Each bit line 105 of the memory array is connected to an input of a column decoder 108 that selects a byte of bit lines to its outputs. Each of the column decoder outputs is connected to a respective sense amplifier 102 first input. The output of the multiplexer 106 is connected to a second input of each of the sense amplifiers 102. Each sense amplifier 102 functions as a comparator, for comparing the drain current of each coupled bit line with the drain current of one of the reference cells. The outputs of the sense amplifiers 102 are connected to a decoder 107 which represents the output of the comparison of the sense amplifiers 102 as a digital signal.

In order to verify or read the state of more than one byte of the bit lines, additional sense amplifiers would be required in the circuit of FIG. 1. Such additional circuitry would occupy significant space on an integrated circuit which, as indicated above, is undesirable.

With the circuit of FIG. 1, the output of the decoder 107 can be provided to a page buffer to store the memory cell states for faster data access than reading each memory cell state serially through the sense amplifiers 102. To improve operation speed further, a reference Kobayashi, et al., "A 3.3 V Only 16 Mb DINOR Flash Memory", ULSI Laboratory, Mitsubishi Electric Corporation, Itami Japan, (hereinafter the Mitsubishi reference), discloses a memory device that performs read and verify operations using a page buffer directly, rather than first using sense amplifiers. The Mitsubishi reference also enables more than a byte of memory cells to be read or verified at one time.

Figure 2:
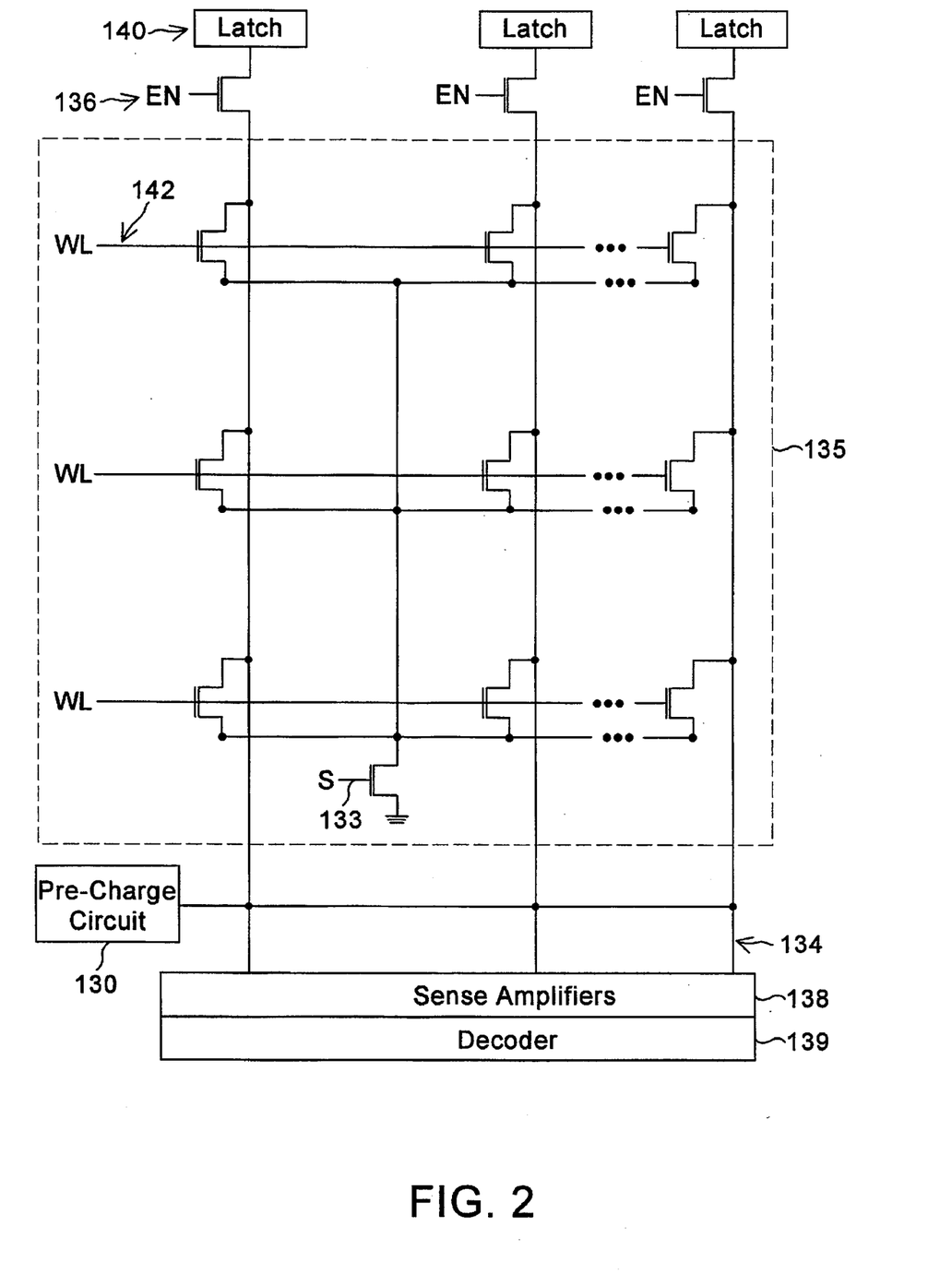
FIG. 2 shows circuitry for a conventional memory device in which read and verify operations are performed directly by a page buffer.

FIG. 2 shows circuitry for the Mitsubishi reference which includes a memory array 135, similar to FIG. 1, and a page buffer, including latches 140. Although read and verify are provided directly by latches 140 of a page buffer, the Mitsubishi reference circuitry also provides connections to sense amplifiers 138 and decoders 139 similar to that shown in FIG. 1.

In the Mitsubishi reference during a read or verify operation to determine values stored in a word of memory cells, one of the word lines 142 in memory array 135 is set to a voltage approximately ½ Vcc. A select signal (S) connected to the gate of discharge transistor 133 is set to ground, and a precharge circuit 130 charges every even bit line in bit lines 134 to Vcc. Each odd bit line in bit lines 134 is set to ground. Once the even bit lines are charged to Vcc, the select signal is set to Vcc. Each even bit line is thereby able to be discharged to ground through a respective selected memory cell, if the memory cell has been erased to have a threshold voltage below ½ Vcc.

After a predetermined time, a latch enable signal is briefly applied to the gates of a set of even latch enable transistors 136. Accordingly, each even latch in latches 140 of the page buffer is switched to the state of a respective even bit line. The above process is then repeated for the odd bit lines. Even and odd bit lines are operated separately because of possible signal interference caused to a bit line by the parasitic capacitance associated with each adjacent bit line.

Although the memory device shown in FIG. 2 performs parallel read and verify operations on large numbers of memory cells, the verify and read operations may not be performed reliably with process, temperature or Vcc variations. With a variation in Vcc after programming, a voltage of ½ Vcc applied to the word lines of the memory cells to be read will vary, while the threshold of the memory cells remain constant. This is likely to cause a read error. Similarly, read errors are likely to be caused when the thresholds of the memory cells are altered by changes in temperature, while Vcc remains constant.

In light of the conventional art, memory designers are forced to choose between a reliable but low speed single byte read or verify circuit and the less reliable, but higher speed of the Mitsubishi reference circuit.

SUMMARY OF THE INVENTION

The present invention enables a page buffer to latch the values stored in more than a byte of memory cells in parallel without first using separate sense amplifier circuitry, while ensuring the values latched are accurate irrespective of temperature, Vcc, and process variations.

The present invention includes a floating gate memory, such as a flash memory, with a page buffer, a bias generator circuit, and a reference cell array enabling parallel reading and verifying of values stored on a word line of memory cells directly by the page buffer.

The reference cell array includes circuitry providing a single signal to the source of a bias cascode transistor in the bias generator circuit. The reference array can include a reference cell for read operations and a reference cell for verify operations so that optimum threshold voltages can be used in the respective operations. Also, multiple read reference cells or verify reference cells may be coupled in parallel to improve the response time and stability of the bias generator circuit.

The bias generator circuit, in addition to the bias cascode, further includes a first bias inverter and a bias load transistor. In the bias generator circuit, the bias cascode has a drain providing the reference signal to an input of the bias inverter, while the bias inverter output is coupled to the gate of the bias load transistor. The bias load transistor has a source to drain path coupling Vcc to the first inverter input.

The page buffer includes a set of latches with a first inverter of each latch having an input coupled to a memory cell by the page buffer cascode. The first inverter in each latch also has transistors with sizes matching the transistors in the first bias inverter. A latch load transistor is connected between a pull-up and pull-down transistor of a second inverter in each latch. The gate of the latch load transistor is coupled to the gate of the bias load transistor, so that the first inverter of each latch has an input mirroring the input of the first bias inverter. Likewise, each accessed memory cell gate and reference cell gate are coupled to the same voltage source.

By being configured as described, each page buffer latch provides the dual function of a sense amplifier and data storage element. As configured, during a read or verify operation, each latch will be set in response to the difference between a reference cell threshold voltage and a respective memory cell threshold voltage. Reliable operation with Vcc, temperature, and process variations is provided by having the width to length ratio of certain transistors in the bias circuitry match corresponding transistors in the page buffer circuitry.

BRIEF DESCRIPTION OF THE DRAWINGS

Further details of the present invention are explained with the help of the attached drawings in which.

DETAILED DESCRIPTION

Figure 3:
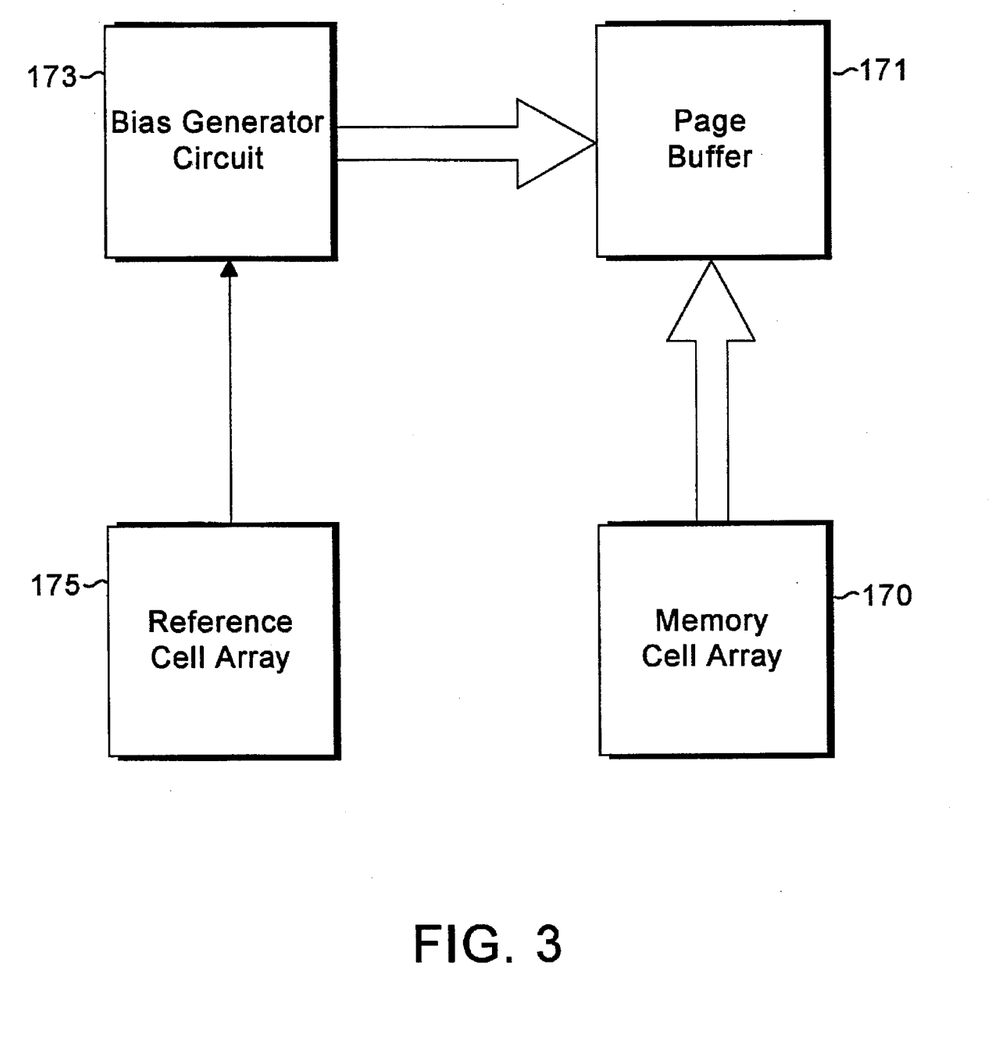
FIG. 3 shows a block diagram for circuitry of the present invention.

FIG. 3 shows a block diagram for circuitry of the present invention. As shown, a memory cell array 170 provides connections to a page buffer 171. The page buffer 171 is connected to receive signals from a bias generator circuit 173. Further, the bias generator circuit 173 is connected to an output of a reference cell array 175 to receive a reference signal.

Figure 4:
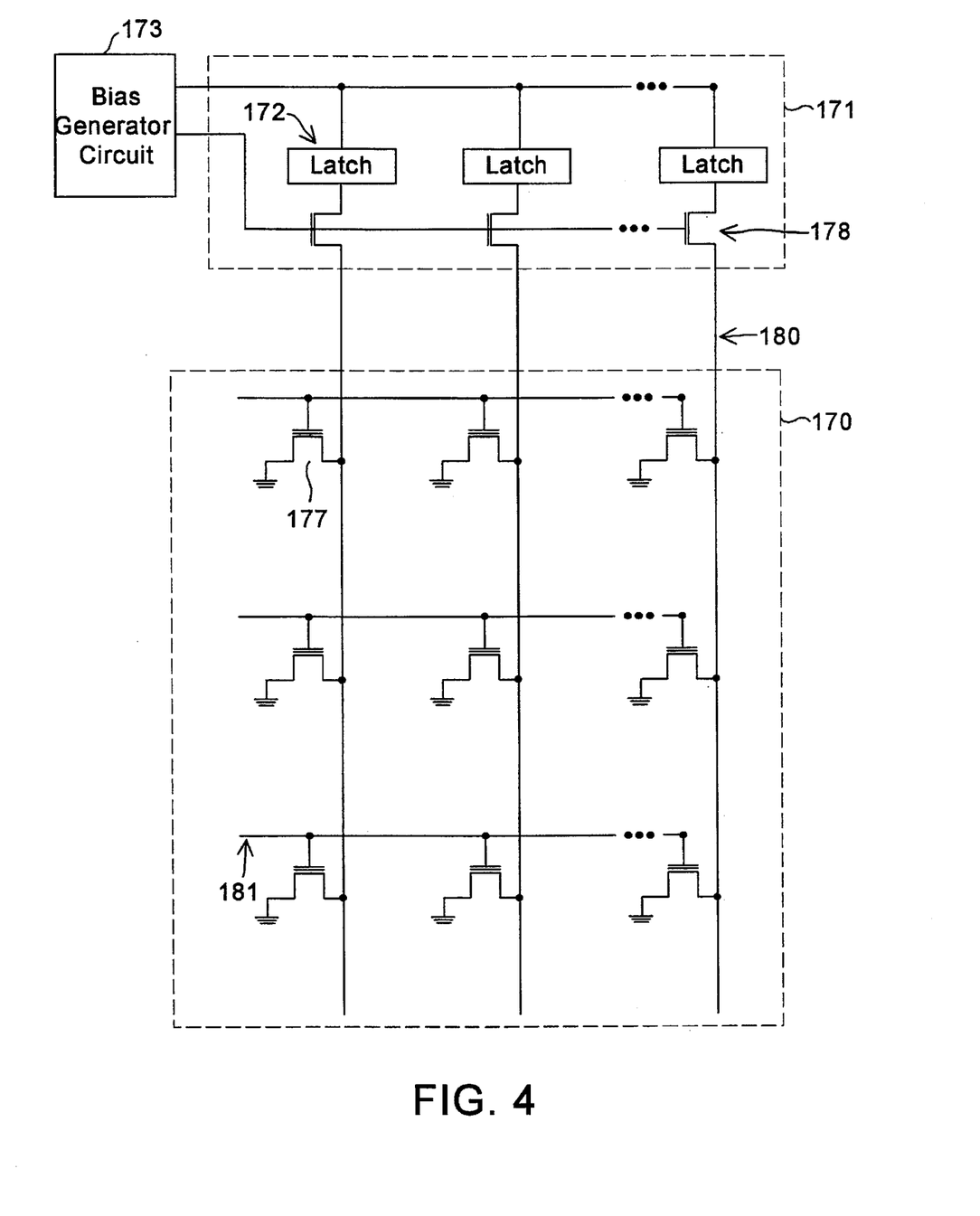
FIG. 4 shows circuitry for the page buffer and memory array of FIG. 3.

FIG. 4 shows circuitry for the page buffer 171 and memory cell array 170. The memory cell array 170 is made up of a group of memory cells, such as cell 177, with gates connected to word lines 181. In one embodiment of the invention, the memory cell array 170 includes 8192 word lines with 4096 cells connected to each word line. Each memory cell, such as cell 177, is preferably a flash EEPROM memory cell, but may be another type of programmable memory cell. The drains of the memory cells are connected by one of bit lines 180 to the page buffer 171. The page buffer 171 includes latches 172, one latch for each bit line from memory array 170. The page buffer 171 also includes page buffer cascode transistors 178. Each page buffer cascode has a drain connected to a latch, a gate connected to a voltage reference, and a source connected to a bit line 180 from the memory cell array 170.

Figure 5:
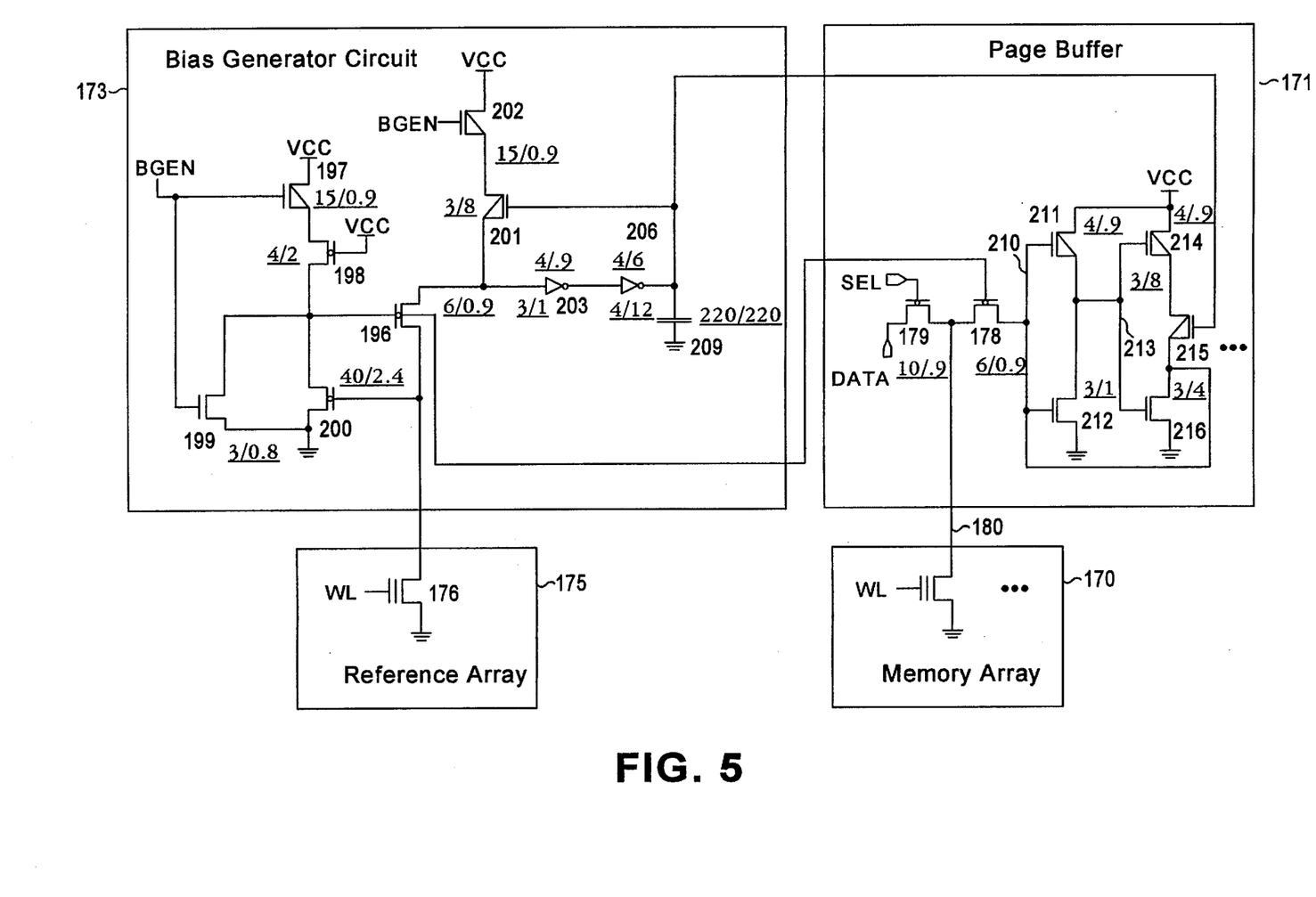
FIG. 5 shows details of one embodiment for circuitry for the block diagram of FIG. 3.

FIG. 5 shows circuitry for the bias generator circuit 173, reference array 175, a single latch in page buffer 171, and a single memory cell in memory array 170. For transistors shown in FIG. 5, suggested dimensions for one possible embodiment of the present invention are underlined and indicated next to the transistor with width indicated first in microns and length indicated second in microns. Inverter symbols, such as 203, represent a PMOS pull-up transistor and an NMOS pull-down transistor connected in a CMOS configuration. For inverter symbols, dimensions for the PMOS transistor are shown above the inverter symbol and dimensions for the NMOS transistor are shown below the inverter symbol. For FIG. 5, PMOS transistors shown individually, such as transistor 197, are represented with a diagonal line from source to drain, while NMOS transistors, such as transistor 200, are represented without such a diagonal line. Transistor sizes and types are only suggested and may be changed to meet particular design requirements.

In FIG. 5, the reference cell array 175 includes a single transistor 176 with a gate receiving the word line voltage (WL) applied to the word line of memory cells accessed in memory cell array 170. The source of reference cell 176 is connected to Vss, while its drain provides the reference signal to bias generator circuit 173. The reference cell 176 is preferably a flash memory cell with a size matching cells in memory array 170 in the same integrated circuit. The reference cell 176 may be programmed to provide a read threshold, verify erase threshold, or verify program threshold similar to reference cells in U.S. application 08/160,582, discussed previously.

The bias generator circuit 173 includes a bias cascode transistor 196 having a source connected to receive the reference signal from the reference array 175 and a drain coupled to both the drain of a bias load transistor 201 and the input of a first bias inverter 203. Bias load transistor 201 has a source connected to the drain of a pull-up transistor 202. The gate of transistor 202 is connected to a bias generator enable voltage (BGEN) for enabling and disabling the bias generator, and its source is connected to Vcc. The first bias inverter 203 has an output connected to an input of a buffer inverter 206. The output of inverter 206 is connected back to the gate of the bias load transistor 201. The output of inverter 206 is further coupled to ground through a capacitor 209. In one embodiment of the present invention, the capacitor 209 is formed by a transistor having a channel width and channel length. One possible set of channel width and channel length values is underlined and indicated to the right side of capacitor 209 in FIG. 5, with width indicated first in microns and length indicated second in microns.

In the bias generator circuit 173, transistors 197, 198, 199, and 200 combine to generate a voltage reference which is applied to the gate of cascode 196. Transistor 197 has a source connected to Vcc, a gate connected to the bias generator enable voltage (BGEN) for enabling and disabling the bias generator, and a drain connected to the source of transistor 198. Transistor 198 has a gate connected to Vcc, and a source to drain path connected between the drains of transistor 197 and transistors 199 and 200. Transistor 200 has a gate connected to the output of the reference array 175 and a source coupled to ground. Transistor 199 has a gate connected to the bias generator enable voltage (BGEN) and a source connected to ground.

The page buffer 171 is shown with circuitry for a single latch representative of latches in the remaining page buffer circuitry. Each latch includes a first inverter 210 made up of a PMOS pull-up transistor 211 and an NMOS pull-down transistor 212. Each latch further includes a second inverter 213 made up of a PMOS pull-up transistor 214 and an NMOS pull-down transistor 216. The input of the first latch inverter 210 is connected by a page buffer cascode 178 to a bit line 180 from the memory cell array 170. The output of the first latch inverter 210 is coupled to the input of the second latch inverter 213. Each latch further includes a latch load transistor 215 having a source-to-drain path connecting the drain of pull-up transistor 214 to the drain of pull-down transistor 216. The drain of the output from the NMOS pull-down transistor 216 forms the output of the second latch inverter 213, which is coupled to the input of the first latch inverter 210. The gate of latch load transistor 215 is coupled to the gate of the bias load transistor 201.

To enable the input of the first latch inverter 210 to mirror the input of the first bias inverter 203, each page buffer cascode 178 preferably has a channel width to channel length ratio substantially equal to the channel width to channel length ratio of the bias cascode 196. Further, the channel width to channel length ratio for each of the transistors in the first latch inverters, such as 210, are set to match the channel width to channel length ratio for corresponding transistors in the first bias inverter 203. Further, the channel width to channel length ratio of each latch load transistor, such as 215, are preferably substantially equal to the channel width to channel length ratio of the bias load transistor 201. With such transistor sizes, the characteristics of the input of the first latch inverter 210 will track the characteristics of the input of the first bias inverter 203 irrespective of Vcc, temperature, and process variations.

In operation with current initially provided by the drain of reference cell 176, the output of the buffer inverter 206 will start switching towards a logic low. In response to a decrease in the signal at the output of inverter 206, the bias load transistor 201 begins to increase the current provided to the input of inverter 203. Once the voltage at the input of inverter 203 goes above its threshold, the output of the buffer inverter 206 begins to switch to a logic high. With the output of inverter 206 high, the bias load transistor 201 begins to decrease current provided to the input of inverter 203. Once the voltage at the input of inverter 203 decreases below its threshold voltage, the output of inverter 206 is driven back towards a logic low. This process continues until the signal on the output of inverter 206 settles to a constant DC voltage with an offsetting ripple.

The capacitance of the capacitor 209 and the size of transistors in inverter 206 are selected to set the DC voltage and ripple at the output of inverter 206. With the transistor and capacitor channel width and channel length values shown in FIG. 5, the signal at the output of inverter 206 is set to have a DC voltage with an offsetting ripple having a peak to peak voltage less than 50 millivolts which causes the voltage at the input of inverter 203 to remain near its threshold.

Since the voltage at the input of inverter 203 is maintained near its threshold, the voltage at the input of inverter 210 will be near its threshold when the threshold of the memory cell connected to cascode 178 has the same threshold as the reference cell 176. Thus, when the threshold of memory cell 170 is reduced below the threshold of reference cell 176, the latch 172 will be reset with the input of inverter 210 low. When the threshold of memory cell 170 is increased above the threshold of reference cell 176, the latch 172 will be set with the input of inverter 210 high.

The configuration of FIG. 5, thus enables the threshold, or state, of a memory cell to be determined relative to the threshold of a reference cell similar to the configuration of U.S. patent application 08/160,582, discussed previously. Unlike in U.S. application 80/160,582, which requires additional sense amplifiers to determine the state of each additional memory cell, the present invention utilizes bias circuitry 173 which does not require duplication when any additional number of memory cells is read or verified in parallel.

Like the Mitsubishi reference, discussed previously, the configuration of FIG. 5 allows more than a byte of memory cells to be read or verified at one time directly by a page buffer. However, unlike the Mitsubishi reference, with any changes in Vcc, temperature, or manufacturing processes, similar characteristic changes will occur in both the reference and memory cells, both the bias and latch load transistors, both the bias and latch cascodes, and both the bias and latch inverters. This enables the present invention to provide an accurate determination of the threshold of a memory cell irrespective of Vcc, temperature or process variations.

To enable a user to set or preset latch 172 independent of the memory cell states, a transistor 179 has a source to drain path connecting the source of the bias cascode 178 to a DATA signal as controlled by a select signal SEL applied to its gate. To set the latch, the DATA signal voltage is provided above the threshold of inverter 210 when the SEL signal is high. The latch is reset when the DATA signal voltage is provided below the threshold of inverter 210 when the SEL signal is high. SEL is then provided as a low signal to remove the DATA signal from the source of cascode 178 during read or verify of the memory cell state.

In an alternative embodiment of the present invention, a number "r" of parallel reference transistors may be utilized instead of a single reference cell 176 in the reference array 175. As with the single reference cell of FIG. 5, each of the r parallel reference transistors has a drain connected to cascode 196 of the bias generator circuit 173, a gate connected to receive a word line signal (WL) provided to activated memory cells, and a source connected to Vss. In one embodiment, the number r is 16. Multiple reference cells are utilized to increase current which may be necessary to improve the response time and stability of the bias generator.

With r reference cells provided in parallel in the reference array 175, circuitry in the bias generator 173 is preferably modified. One acceptable modification is as follows. First, the bias cascode transistor 196 is replaced by r parallel bias cascode transistors with connections matching bias cascode transistor 196. Each of the r bias cascode transistors is preferably an NMOS transistor having a channel width to channel length ratio that substantially matches the channel width to channel length ratio of each page buffer cascode, such as transistor 178. Second, the bias load transistor 201 is replaced by r parallel bias load transistors with connections matching bias load transistor 201. Each of the r bias load transistors is preferably a PMOS transistor having a channel width to length ratio that substantially matches the channel width to channel length ratio of each latch load transistor, such as transistor 215.

Alternatively, with r reference cells provided in parallel in reference array 175, the bias generator may be acceptably modified by increasing the size of bias cascode 196 and bias load transistor 201, rather than utilizing multiple transistors 196 and 201. With r reference cells, the width to length ratio of the bias cascode 196 is preferably increased to r times the width to length ratio of each page buffer cascode, such as 178. Further, with r reference cells, the width to length ratio of the bias load transistor 201 is preferably increased to r times the width to length ratio of each latch load transistor, such as 215.

In another alternate embodiment of the present invention, the reference cell 176 has a channel width to channel length ratio that is "r" times a channel width to channel length ratio for each memory cell, such as 177. In this embodiment, the circuitry in the bias generator 173 is preferably modified in either one of the two aforementioned manners that were set forth for modifying the bias generator 173 when "r" parallel reference transistors were employed.

Figure 6:
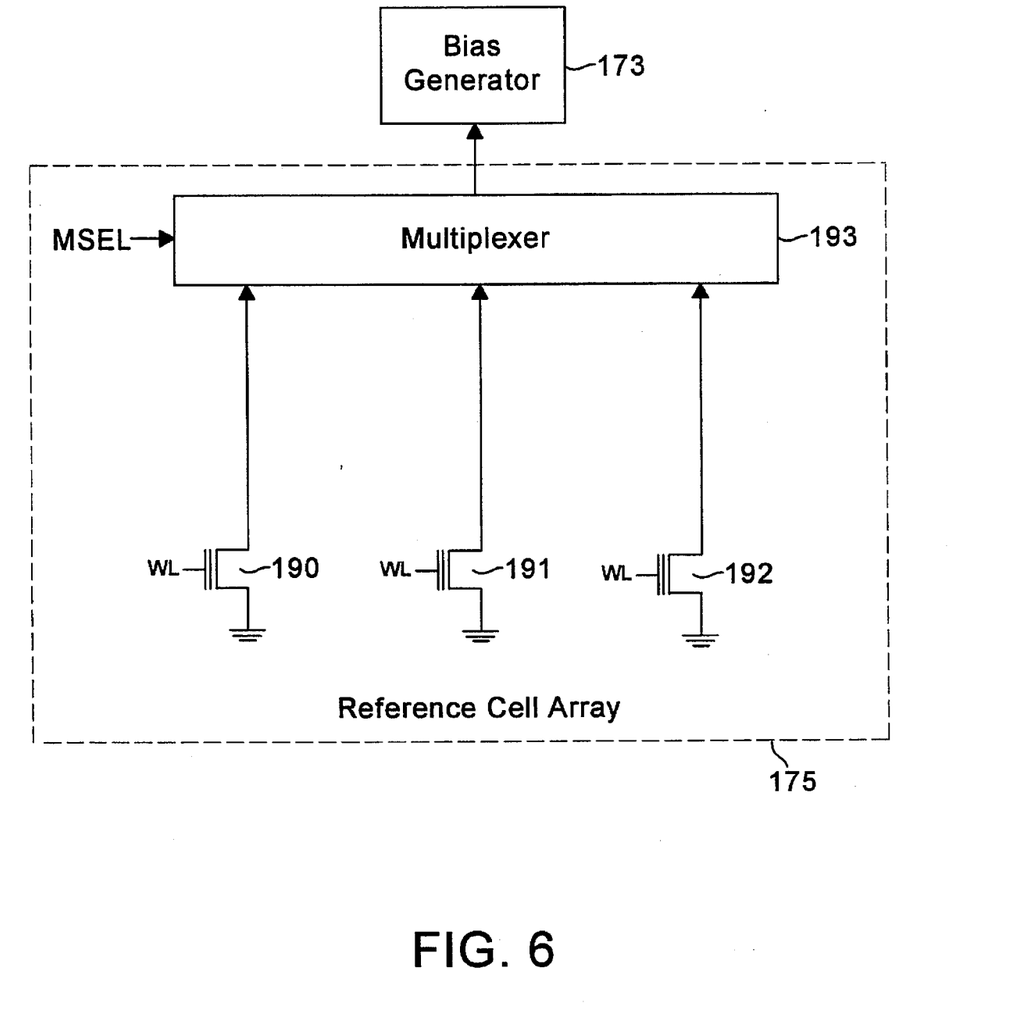
FIG. 6 shows an alternative embodiment for the reference cell array of FIG. 5.

FIG. 6 shows an alternative embodiment for circuitry for the reference cell array 175 to enable verify and read to be performed similar to the circuitry of U.S. patent application 08/160,582, discussed previously. As shown, the alternative embodiment for the reference array 175, includes a read reference cell 190, verify program reference cell 191 and verify erase reference cell 192, each with a drain connected to multiplexer 193. The output of the multiplexer 193 provides the drain output from one of reference cells 191, 192 and 193 as the source connection to cascode 196 of FIG. 5 as controlled by a multiplexer select signal (MSEL).

As disclosed in U.S. patent application 08/160,582, discussed previously, each verify program reference cell 191 has a threshold set to a minimum value for a programmed memory cell threshold, such as 4.0 volts; each verify erase reference cell 192 has a threshold set to a maximum value for an erased memory cell threshold, such as 1.0 volts, and each read reference cell 190 has a threshold between the verify program and verify erase thresholds, such as at 2.5 volts. Verify and erase procedures are then performed by a comparison of drain currents of the reference and memory cells similar to that described in U.S. application 08/160, 582, but with comparisons made using the bias generator and page buffer latches, as described above, rather than sense amplifiers.

As with the reference cell 176 of FIG. 5, each of reference cells 190, 191 and 192 is preferably a flash EEPROM cell, but may be another type of programmable memory cell. Further, reference cells 190, 191 and 192 each have a channel width to channel length ratio substantially matching the channel width to channel length ratio of the cells in memory cell array 170 which are on the same integrated circuit. AS with the reference cell 176 of FIG. 5, each of reference cells 190, 191 and 192 has a source connected to Vss and a gate connected to receive the word line voltage (WL) applied to cells activated in the memory cell array 170.

In an alternative circuitry for the reference array of FIG. 6 to improve response time and stability of the bias generator, the present invention may include r parallel reference cells for each of reference cells 190, 191 and 192. The r parallel reference cells employed for each of reference cells 190, 191 and 192 are configured similarly to the configuration for the r parallel reference cells used to replace cell 176 in FIG. 5, as discussed previously. With reference cells 190, 191 and 192 each replaced by r parallel reference cells, bias cascode 196 and bias load transistor 201 of the bias generator 173 are likewise each preferably replaced by either r similar parallel transistors, or a transistor having a width to length ratio of r times a width to length ratio of a corresponding transistor in page buffer 171, similar to the configuration described when cell 176 of FIG. 5 is replaced by r parallel reference cells.

Although the invention has been described above with particularity, this was merely to teach one of ordinary skill in the art how to make and use the invention. Many modifications will fall within the scope of the invention, as that scope is defined by the following claims.

What is claimed is:

1. A memory device comprising:
   a memory array including a first memory cell having a gate coupled to receive a word line voltage, and a source to drain path;
   a reference array including a first reference cell having a gate coupled to receive the word line voltage, and a source to drain path; and
   a page buffer having a first latch comprising:
   a first latch inverter having an input couplable to the source to drain path of the first memory cell, and an output; and
   a second latch inverter having an input coupled to the first latch inverter output, and an output coupled to the first latch inverter input and the source to drain path of the first reference cell.

2. The memory device of claim 1 further comprising:
   a bias generator comprising:
   a bias cascode having a gate connected to a second voltage reference, and a source to drain path coupled on a first end to the source to drain path of the first reference cell, a first bias inverter having an input coupled to a second end of the source to drain path of the bias cascode, and an output, and a bias load transistor having a gate coupled to the first bias inverter output, and a source to drain path coupling Vcc to the first bias inverter input, and wherein the page buffer further comprises:

a first page buffer cascode having a gate coupled to the second voltage reference, and a source to drain path coupling the first latch inverter input to the source to drain path of the first memory cell, wherein the first latch further includes a latch load transistor having a source to drain path coupled on a first end to the second latch inverter output, and a gate coupled to the gate of the bias load transistor, and wherein the second latch inverter further includes a second latch inverter pull-up transistor having a source to drain path coupled to a second end of the source to drain path of the latch load transistor, and a gate, and a second latch inverter pull-down transistor having a source to drain path coupled to the second latch inverter output, and a gate coupled to the gate of the second latch inverter pull-up transistor to form the second latch inverter input.

3. The memory device of claim 2, wherein the bias generator further includes a buffer inverter coupling the first bias inverter output to the gate of the bias load transistor, and wherein the bias load transistor is a PMOS transistor having a source coupled to Vcc by the source to drain path of a power supply transistor and the latch load transistor is a PMOS transistor.

4. The memory device of claim 2, wherein the gate of the bias load transistor is coupled to a capacitor.

5. The memory device of claim 4, wherein a ripple voltage at an output of the buffer inverter has a peak to peak voltage that is less than 50 millivolts.

6. The memory device of claim 2, wherein said first bias inverter includes a pull-up transistor having a gate forming the first bias inverter input, a source to drain path coupled to the first bias inverter output, and a width to length ratio, and said first latch inverter includes a pull-up transistor having a gate forming the first latch inverter input, a source to drain path coupled to the first latch inverter output, and a width to length ratio substantially matching the width to length ratio of the first bias inverter pull-up transistor, and wherein said first bias inverter includes a pulldown transistor having a gate forming the first bias inverter input, a source to drain path coupled to the first bias inverter output, and a width to length ratio, and said first latch inverter includes a pull-down transistor having a gate forming the first latch inverter input, a source to drain path coupled to the first latch inverter output, and a width to length ratio substantially matching the width to length ratio of the first bias inverter pull-down transistor.

7. The memory device of claim 2, wherein the reference cell array comprises r parallel reference cells including the first reference cell, each of said r parallel reference cells having a gate coupled to receive the word line voltage, and a source to drain path coupled to the first end of the source to drain path of the bias cascode.

8. The memory device of claim 7, wherein r=16.

9. The memory device of claim 7, wherein the first page buffer cascode has a width to length ratio, and the bias cascode has a width to length ratio that is substantially equal to the width to length ratio of the page buffer cascode multiplied by r.

10. The memory device of claim 9, wherein r=16.

11. The memory device of claim 7, wherein the bias cascode of the bias generator is one of r parallel bias cascodes, each of the r parallel bias cascodes having a gate coupled to the second voltage reference, and a source to drain path coupled on a first end to the source to drain path of the first reference cell and coupled on a second end to the first bias inverter input, wherein each of the r parallel bias cascodes has a width to length ratio that is substantially equal to a width to length ratio of the first page buffer cascode.

12. The memory device of claim 7, wherein the latch load transistor has a width to length ratio and the bias load transistor has a width to length ratio that is substantially equal to the width to length ratio of the latch load transistor multiplied by r.

13. The memory device of claim 7, wherein the bias load transistor of the bias generator is one of r parallel bias load transistors, each of the r parallel bias load transistors has a gate coupled to the first bias inverter output, and a source to drain path coupling the Vcc reference to the first bias inverter input, wherein the latch load transistor has a width to length ratio and each of the r parallel bias load transistors has a width to length ratio substantially equal to the width to length ratio of the latch load transistor.

14. The memory device of claim 1, wherein the memory array includes b memory cells, including the first memory cell, each of the b memory cells having a gate coupled to receive the word line voltage, and a source to drain path, and wherein the page buffer includes latches, including the first latch, each one of the latches comprising:

a first latch inverter having an input coupled to the source to drain path of a respective one of the b memory cells, and an output; and a second latch inverter having an input coupled to the parallel first latch inverter output, and an output coupled to the first latch inverter input and to the source to drain path of the first reference cell.

15. The memory device of claim 14, wherein b=4096.

16. The memory device of claim 14, wherein the memory array includes a plurality of word lines, and the b memory cells include all memory cells in the array having gates connected to one of the word lines.

17. The memory device of claim 1, wherein the reference array includes a multiplexer and a second reference cell, said second reference cell having a gate coupled to the word line voltage reference, a source to drain path connected to a first input of the multiplexer, and a threshold voltage that is greater than a threshold voltage of the first reference cell, said multiplexer having a second input connected to the source to drain path of the first reference cell, an output couplable to the second latch inverter output, and a read/verify select input for selecting the second input to the output during a read state and selecting the first input to the output during a verify state.

18. The memory device of claim 17, wherein the reference cell array includes r second parallel reference cells including the second reference cell, each of said r second parallel reference cells having a gate coupled to the word line voltage reference, a source to drain path connected to the first input of the multiplexer, and a threshold voltage that is greater than the threshold voltage of the first reference cell.

19. The memory device of claim 1 wherein the first memory cell and the first reference cell are flash programmable EEPROM memory cells.

20. A method for reading and verifying the values stored in a set of memory cells in parallel, said method comprising the steps of:

generating a reference signal from a reference cell array;

converting the reference signal into a bias signal;

coupling said bias signal to a set of latches;

coupling each of the latches to a respective memory cell in the set of memory cells.

21. The method of claim 20, wherein the set of memory cells are included in an array of memory cells, the set including all memory cells in the array having gates connected to a single word line.

22. A memory device comprising:

a memory array including a first memory cell having a gate coupled to a word line voltage reference, and a source to drain path;

a reference array including r reference cells, each of said r reference cells having a gate coupled to the word line voltage reference, and a source to drain path;

a bias generator comprising, a bias cascode having a gate connected to a second voltage reference, and a source to drain path connected on a first end to a first end of the source to drain path of each of the r reference cells, a first bias inverter having an input coupled to a second end of the source to drain path of the bias cascode, an output, a first bias inverter pull-up transistor having a gate and a source to drain path, and a first bias inverter pull-down transistor having a gate coupled to the gate of the first bias inverter pull-up transistor to form the first bias inverter input, and a source to drain path coupled to the source to drain path of the first bias inverter pull-up transistor to form the first bias inverter output, a buffer inverter having an input coupled to the first bias inverter output, an output, a buffer inverter pull-up transistor having a gate and a source to drain path, and a buffer inverter pull-down transistor having a gate coupled to the gate of the buffer inverter pull-up transistor to form the buffer inverter input, and a source to drain path coupled to the source to drain path of the buffer inverter pull-up transistor to form the buffer inverter output, a feedback capacitor having a first end coupled to the buffer inverter output, and a bias load transistor having a gate coupled to the buffer inverter output, and a source to drain path coupling a Vcc reference to the first bias inverter input; and a page buffer including, a first page buffer cascode having a gate coupled to the second voltage reference, and a source to drain path coupled on a first end to a first end of the source to drain path of the first memory cell, and a latch comprising, a first latch inverter having an input coupled to a second end of the source to drain path of the first page buffer cascode, an output, a first latch inverter pull-down transistor having a gate, and a source to drain path coupled to the first latch inverter output, and a first latch inverter pull-up transistor having a gate coupled to the gate of the first latch inverter pull-down transistor to form the first latch inverter input, and a source to drain path coupled to the first latch inverter output, a second latch inverter having an input coupled to the first latch inverter output, and an output coupled to the first latch inverter input, a second latch inverter pull-up transistor having a source to drain path and a gate, and a second latch inverter pull-down transistor having a source to drain path coupled to the second latch inverter output, and a gate coupled to the gate of the second latch inverter pull-up transistor to form the second latch inverter input, and a latch load transistor having a source to drain path coupling the source to drain path of the second latch inverter pull-up transistor to the second latch inverter output, and a gate coupled to the gate of the bias load transistor.

23. The memory device of claim 22, wherein the pull-up transistor of the first bias inverter has a width to length ratio substantially matching a width to length ratio of the pull-up transistor of the first latch inverter and the pull-down transistor of the first bias inverter has a width to length ratio substantially matching a width to length ratio of the pull-down transistor of the first latch inverter.

\* \* \* \* \*